(12) United States Patent
Fromm

(10) Patent No.: US 10,132,840 B2
(45) Date of Patent: Nov. 20, 2018

(54) ELECTRICAL CURRENT MEASURING DEVICE FOR MEASURING AC CURRENT

(71) Applicant: Wilhelm Fromm, Kreuzlingen (CH)

(72) Inventor: Wilhelm Fromm, Kreuzlingen (CH)

(*) Notice: Subject to any disclaimer, the term of this patent is extended or adjusted under 35 U.S.C. 154(b) by 108 days.

(21) Appl. No.: 15/270,159

(22) Filed: Sep. 20, 2016

(65) Prior Publication Data

US 2017/0082658 A1 Mar. 23, 2017

(30) Foreign Application Priority Data

Sep. 23, 2015 (DE) .......................... 10 2015 116 084

(51) Int. Cl.
| | |
|---|---|
| *G01R 15/18* | (2006.01) |
| *G01R 19/25* | (2006.01) |
| *G01R 19/06* | (2006.01) |
| *G01R 19/165* | (2006.01) |
| *G01R 19/252* | (2006.01) |
| *G01R 23/16* | (2006.01) |

(52) U.S. Cl.
CPC .......... *G01R 15/183* (2013.01); *G01R 19/06* (2013.01); *G01R 19/16528* (2013.01); *G01R 19/252* (2013.01); *G01R 19/2503* (2013.01); *G01R 19/16547* (2013.01); *G01R 23/16* (2013.01)

(58) Field of Classification Search
CPC .... G01R 15/183; G01R 19/252; G01R 19/06; G01R 19/16528; G01R 19/2503; G01R 19/16547
See application file for complete search history.

(56) References Cited

U.S. PATENT DOCUMENTS

| 4,204,237 A * | 5/1980 | Zocholl ................. H02H 7/045 |
|---|---|---|
| | | 361/36 |
| 4,274,052 A | 6/1981 | Gentry, Jr. et al. |
| 5,933,793 A * | 8/1999 | Yamada ................. G01R 23/20 |
| | | 324/600 |
| 6,282,104 B1 * | 8/2001 | Kern ....................... H02M 1/12 |
| | | 363/34 |

(Continued)

FOREIGN PATENT DOCUMENTS

| CN | 103529321 A | 1/2014 |
|---|---|---|
| EP | 2 827 154 A1 | 1/2015 |

(Continued)

OTHER PUBLICATIONS

Search Report dated Apr. 15, 2016 issued in corresponding DE patent application No. 10 2015 116 084.6 (and partial English translation).

(Continued)

*Primary Examiner* — Jermele M Hollington
*Assistant Examiner* — Dominic E Hawkins
(74) *Attorney, Agent, or Firm* — Posz Law Group, PLC

(57) ABSTRACT

The invention is based on an electrical current measuring device for measuring at least one alternating current, with at least one inductive coupling unit, which is intended to convert at least one electrical primary signal into at least one electrical secondary signal, and with a computing unit, which is intended to determine the primary signal from the secondary signal. The computing unit is intended to take into account at least one higher harmonic of the secondary signal when determining the primary signal.

9 Claims, 4 Drawing Sheets

(56) References Cited

U.S. PATENT DOCUMENTS

Figure 1:
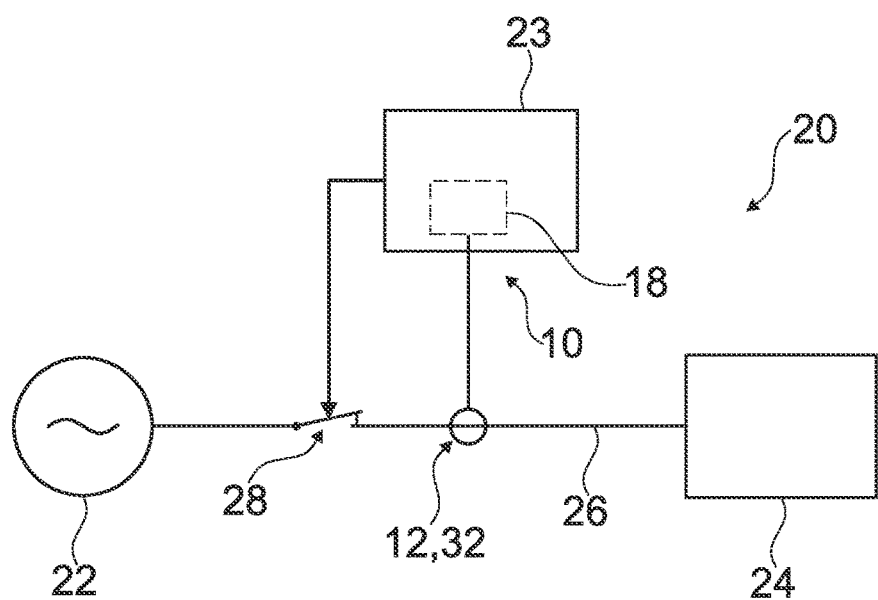

| | | | | |
|---|---|---|---|---|
| 7,212,931 | B2* | 5/2007 | Bierl | G01R 22/10 |
| | | | | 702/61 |
| 7,336,193 | B2* | 2/2008 | Schillert | H01C 7/126 |
| | | | | 307/105 |
| 7,794,457 | B2* | 9/2010 | McPherson | A61B 18/1206 |
| | | | | 336/182 |
| 2005/0212505 | A1* | 9/2005 | Murray | G01R 15/146 |
| | | | | 324/126 |
| 2006/0203412 | A1 | 9/2006 | Schillert et al. | |
| 2009/0219009 | A1* | 9/2009 | Jansen | G01R 15/183 |
| | | | | 324/127 |
| 2010/0070219 | A1* | 3/2010 | Azancot | H02J 5/005 |
| | | | | 702/62 |
| 2010/0179780 | A1* | 7/2010 | Taft | G01R 19/2513 |
| | | | | 702/64 |
| 2011/0156697 | A1* | 6/2011 | Gunn | G01R 15/185 |
| | | | | 324/127 |
| 2012/0001580 | A1* | 1/2012 | Zhang | G01R 31/343 |
| | | | | 318/490 |
| 2012/0206945 | A1* | 8/2012 | Brogan | H02M 1/12 |
| | | | | 363/40 |
| 2013/0127405 | A1* | 5/2013 | Scherer | H02J 7/025 |
| | | | | 320/108 |
| 2013/0285671 | A1* | 10/2013 | Hoffman | G01R 31/027 |
| | | | | 324/547 |

FOREIGN PATENT DOCUMENTS

| | | |
|---|---|---|
| GB | 432008 A | 7/1935 |
| JP | H09-145759 A | 6/1997 |

OTHER PUBLICATIONS

Office Action dated Apr. 15, 2016 issued in corresponding DE patent application No. 10 2015 116 084.6 (and partial English translation).

Extended European Search Report dated Feb. 17, 2017 in the corresponding EP Patent Application No. 16184175.4 (with partial English translation).

Hunt, Rich. "Impact of CT Errors on Protective Relays Case Studies and Analyses." IEEE Transactions on Industry Applications, vol. 48, No. 1, Jan. 1, 2012. pp. 52-61.

* cited by examiner

ELECTRICAL CURRENT MEASURING DEVICE FOR MEASURING AC CURRENT

CROSS REFERENCE TO RELATED APPLICATION

This application is based on and incorporates herein by reference German Patent Application No. 10 2015 116 084.6 filed on Sep. 23.2015.

PRIOR ART

The invention relates to an electrical current measuring device and to a corresponding method.

Electrical current measuring devices for measuring alternating currents have already been proposed, which electrical current measuring devices convert a primary current into a secondary current using an inductive current transformer and evaluate said secondary current in particular, saturation of the current transformer may result in distortion of the secondary current and therefore in incorrect measurement of the primary current.

One object of the invention is, in particular, to provide an electrical current measuring device of the generic type having advantageous properties with regard to a measurement of an alternating current.

ADVANTAGES OF THE INVENTION

The invention is based on an electrical current measuring device for measuring at least one alternating current, with at least one inductive coupling unit, which is configured to convert at least one electrical primary signal into at least one electrical secondary signal, and with a computing unit, which is configured to determine the primary signal from the secondary signal.

It is proposed that the computing unit is intended to take into account at least one higher harmonic of the secondary signal, in particular in addition to a fundamental of the secondary signal, when determining the primary signal.

In this context, an "electrical current measuring device" is intended to be understood as meaning, in particular, at least one part, in particular a subassembly, of a measuring, protective, monitoring and/or control device, in particular an electronic measuring, protective, monitoring and/or control device. In particular, the electrical current measuring device can be partially or completely integrated in a measuring, protective, monitoring and/or control device and/or can be coupled to a measuring, protective, monitoring and/or control device via at least one measuring and/or data line. In this context, an "alternating current" is intended to be understood as meaning, in particular, a sinusoidal alternating current with an at least substantially constant, in particular at least approximately known, frequency. In particular, a frequency of the alternating current corresponds at least substantially to a network frequency of an energy supply network. An "inductive coupling unit" is intended to be understood as meaning, in particular, a unit having at least one signal input and at least one signal output which are inductively coupled to one another. In particular, the inductive coupling unit has at least one primary winding and at least one secondary winding which are wound onto a common ferromagnetic core, in particular using an iron core and/or a ferrite core, which couples the primary winding to the secondary winding. The primary winding forms, in particular, the signal input, whereas the secondary winding forms, in particular, the signal output of the inductive coupling unit. In particular, the inductive coupling unit is in the form of a measuring transformer, preferably a current transformer. In this context, an "electrical primary signal" is intended to be understood as meaning, in particular, a current signal having at least one alternating component. The primary signal is preferably an alternating current signal, in particular a purely sinusoidal alternating current signal. In particular, the primary signal is intended to be fed into the input n side of the coupling unit. In this context, an "electrical secondary signal" is intended to be understood as meaning, in particular, a current and/or voltage signal which is associated with the primary signal and has at least one alternating component, in particular an alternating current component and/or an AC voltage component. In particular, the secondary signal is intended to be tapped off on the output side of the coupling unit. A "computing unit" is intended to be understood as meaning, in particular, a controller having a processor, a memory unit and/or an operating, control and/or calculation program stored in the memory unit. In particular, at least one signal and/or data input of the computing unit is coupled to at least one signal output of the inductive coupling unit.

A "higher harmonic of the secondary signal" is intended to be understood as meaning, in particular, a sinusoidal harmonic oscillation, the frequency of which corresponds to an integer multiple of a fundamental frequency of the secondary signal. The fact that the computing unit is intended "to take into account" at least one higher harmonic of the secondary signal when determining the primary signal is intended to be understood as meaning, in particular, that the computing unit is intended to record and/or calculate at least one higher harmonic of the secondary signal continuously or quasi-continuously for example by means of a harmonic analysis, in particular a Fourier analysis, for example using a discrete and/or fast Fourier transform, and to calculate and/or determine the primary signal continuously and/or quasi-continuously using the at least one higher harmonic of the secondary signal.

As a result of such a configuration, it is possible to provide an electrical current measuring device of the generic type having advantageous properties with respect to a measurement of the amplitude and phase angle of an alternating current. In particular, a primary signal can be advantageously reliably determined by taking into account at least one higher harmonic of the secondary signal. In particular, a primary signal can be determined from the secondary signal without taking into account further parameters, in particular parameters of the inductive coupling unit. Furthermore, a primary signal can be advantageously exactly determined from the secondary signal even in the event of saturation of a core of the inductive coupling unit, which results in distortion of the secondary signal.

It is also proposed that the computing unit is intended to take into account an amplitude of the higher harmonic. An "amplitude" is intended to be understood as meaning, in particular, a maximum deviation of a sinusoidal alternating variable from the position of the arithmetic mean. Furthermore, it is proposed that the computing unit is intended to take into account a phase angle of the higher harmonic. The computing unit is preferably intended to take into account both the amplitude and the phase angle of the higher harmonic. This makes it possible to determine an amplitude and/or a phase angle of a primary signal from a secondary signal in an advantageously simple manner.

It is also proposed that the higher harmonic is an odd higher harmonic of the secondary signal. The higher harmonic is preferably the third harmonic of the secondary signal. In particular, odd higher harmonics and particularly the third harmonic of the secondary signal are/is characteristic of a degree of saturation of a core of the inductive coupling unit in the case of sinusoidal alternating currents. As a result, a primary signal can be advantageously exactly determined from a secondary signal even if a core is saturated.

It is also proposed that the computing unit is intended to use the higher harmonic, in particular an odd higher harmonic and preferably the third harmonic, to determine a correction value for determining the primary signal from the fundamental of the secondary signal. A "correction value" is intended to be understood as meaning, in particular, a value which is intended to be applied against the secondary signal in order to determine the primary signal. As a result, the correct primary signal can be determined in an advantageously simple manner even from a distorted secondary signal.

One preferred configuration of the invention proposes that the computing unit is intended to determine the correction value using a ratio, in particular an absolute value ratio, of the higher harmonic, in particular an odd higher harmonic and preferably the third harmonic, to the fundamental of the secondary signal. In particular, the ratio of the higher harmonic to the fundamental can be obtained by dividing the complex vector of the higher harmonic with the real and imaginary parts by the complex vector of the fundamental with the real and imaginary parts. As a result, the correction value can be determined in an advantageously simple and/or fast manner.

Further an AC voltage installation having at least one electrical current measuring device is proposed in this context, an "AC voltage installation" is intended to be understood as meaning, in particular, an installation having at least one AC voltage source and at least one AC voltage sink. In particular, the AC voltage sink may be in the form of an AC-voltage-operated device and/or an AC-voltage-operated machine. In particular, the AC voltage sink is connected to the AC voltage source via at least one supply line. In particular, the electrical current measuring device is intended to measure an alternating current inside the at least one supply line. This advantageously makes it possible, to measure an alternating current in a supply line of an AC voltage installation. In particular, it is also possible to advantageously detect alternating currents in the event of relatively great deviations of a current variable from the rated values with saturation of the current transformer, for example on account of a short circuit.

The invention also proposes a method using an electrical current measuring device for measuring at least one alternating current, with at least one inductive coupling unit, which is intended to convert at least one electrical primary signal into at least one electrical secondary signal, and with a computing unit, which is intended to determine the primary signal from the secondary signal, at least one higher harmonic of the secondary signal being taken into account, in particular in addition to the fundamental of the secondary signal, when determining the primary signal. The primary signal can be advantageously reliably determined, with the absolute value and angle of its fundamental, by taking into account at least one higher harmonic of the secondary signal. In particular, the primary signal can be determined from the secondary signal without taking into account further parameters, in particular parameters of the inductive coupling unit. Furthermore, a primary signal can be advantageously exactly determined from the secondary signal even in the event of saturation of a core of the inductive coupling unit, which results in distortion of the secondary signal.

In this case, the electrical current measuring device according to the invention is not intended to be restricted to the above-described use and embodiment. In particular, the electrical current measuring device according to the invention may have a number differing from a number of individual elements, components and units mentioned herein in order to implement a method of operation described herein.

DRAWINGS

Further advantages emerge from the following description of the drawings. An exemplary embodiment of the invention is illustrated in the drawings. The drawings, the description and the claims contain numerous features in combination. A person skilled in the art will also expediently consider the features individually and will combine them to form useful further combinations.

Figure 2:
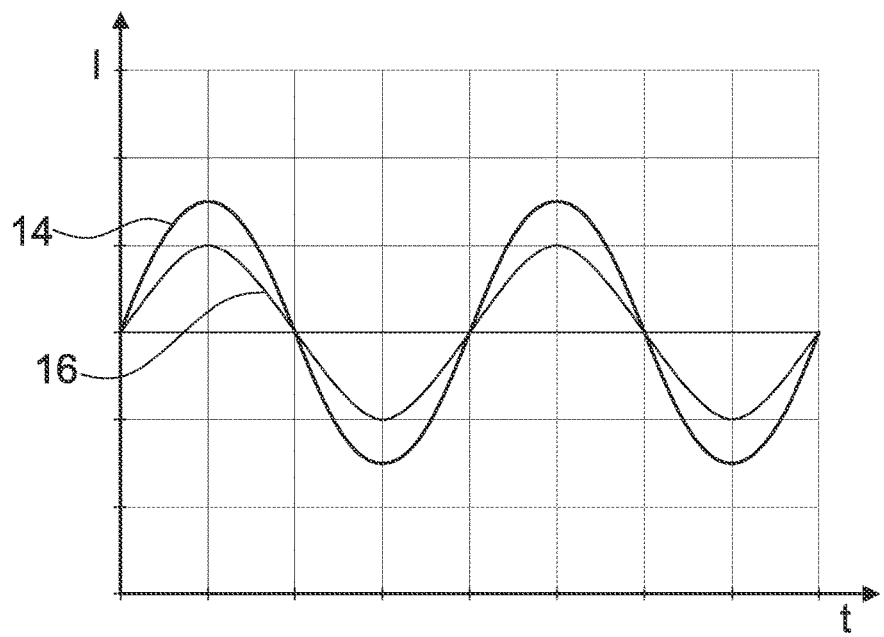
Figure 3:
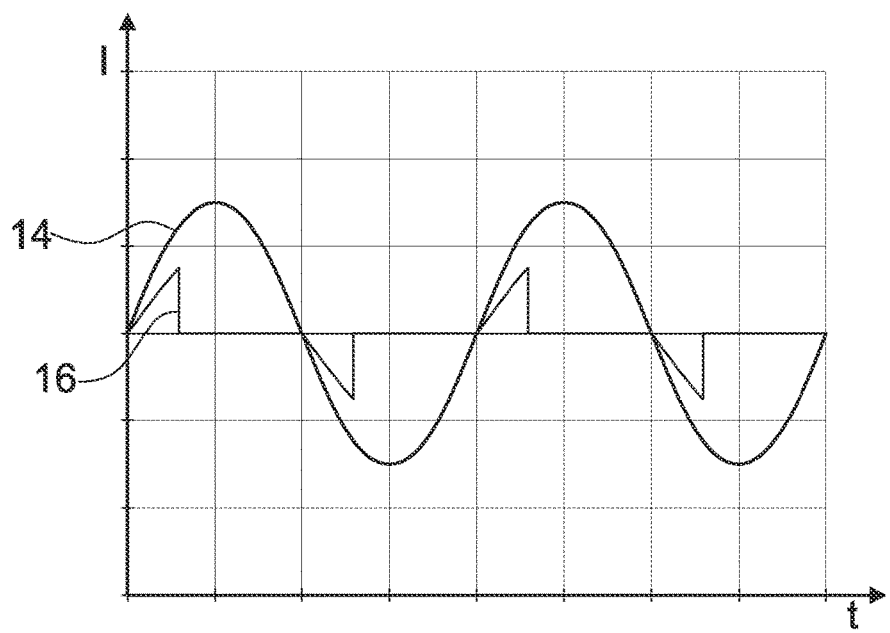
Figure 4:
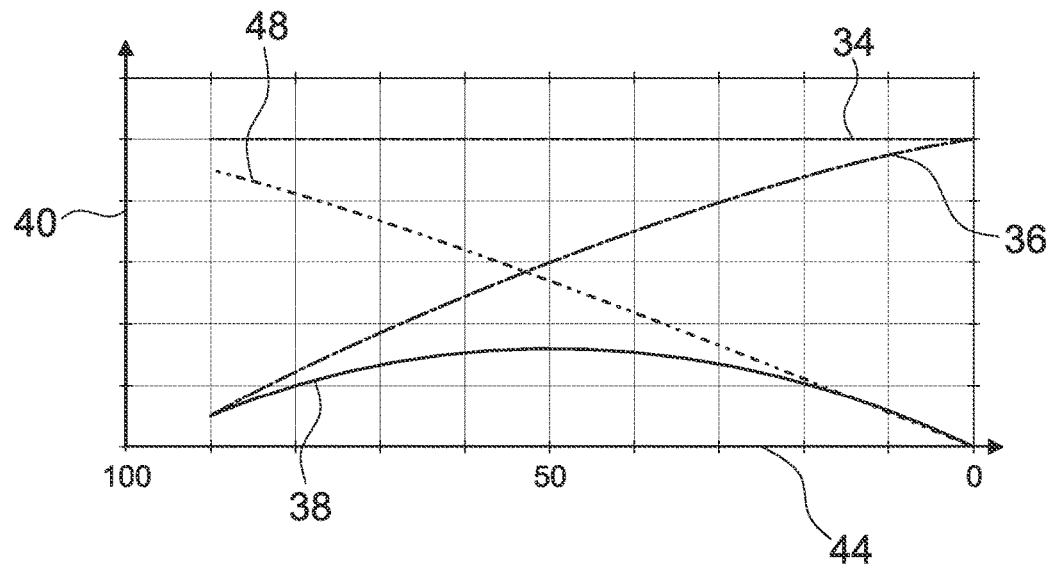
Figure 4:
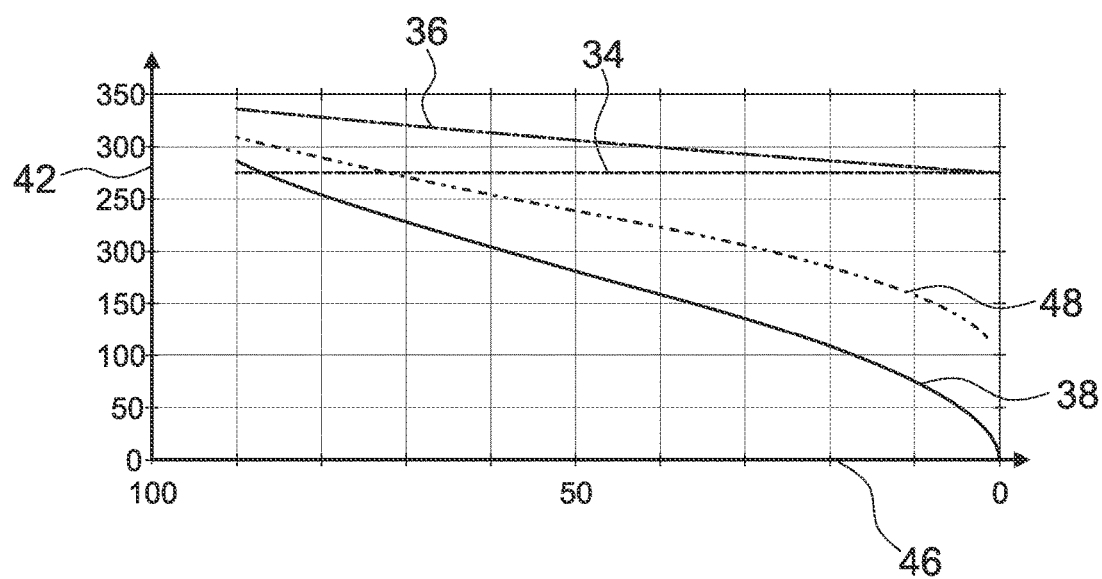
Figure 5:
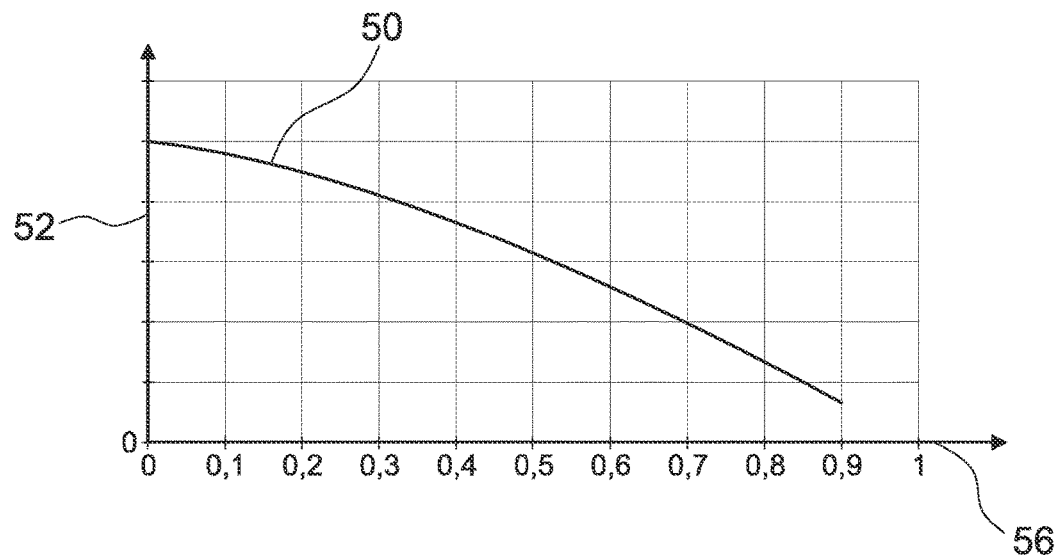
Figure 5:
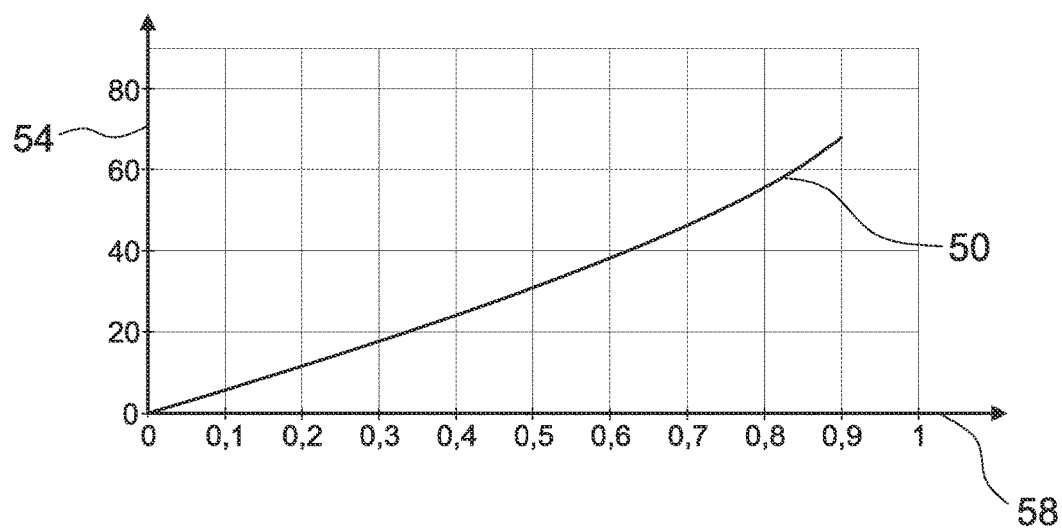

In the drawings:

FIG. 1 shows an AC voltage installation having an electrical current measuring device which has an inductive coupling unit and a computing unit, FIG. 2 shows a temporal profile of a primary signal and a secondary signal, FIG. 3 shows a temporal profile of a primary signal and a secondary signal in the event of saturation of the inductive coupling unit, FIG. 4 shows the fundamental and the third harmonic of the secondary signal on the basis of relative saturation of the inductive coupling unit, and FIG. 5 shows a correction value on the basis of a ratio of the third harmonic to the fundamental of the secondary signal.

DESCRIPTION OF THE EXEMPLARY EMBODIMENT

FIG. 1 shows an AC voltage installation 20 having an AC voltage source 22 and an AC voltage sink 24. The AC voltage sink 24 is connected to the AC voltage source 22 via a supply line 26. The supply line 26 contains a switch 28 which is intended to establish and/or disconnect a power supply for the AC voltage sink 24. The AC voltage installation 20 comprises an electrical current measuring device 10 for measuring at least one alternating current. In particular, the electrical current measuring device 10 is intended to measure an alternating current inside the supply line 26. In this case, the electrical current measuring device integrated in a protective device 30 by way of example. The protective device 30 is intended, in particular, to interrupt the power supply for the AC voltage sink 24, if an overcurrent is determined, by opening the switch 28. Alternatively, an electrical current measuring device may also be integrated in a monitoring device and/or a control device, for example.

The electrical current measuring device 10 has an inductive coupling unit 12. The inductive coupling unit 12 is in the form of an inductive current transformer 32. The inductive coupling unit 12 is intended to convert an electrical primary signal 14 into an electrical secondary signal 16. The primary signal 14 is a sinusoidal alternating current signal and corresponds to an alternating current in the supply line 26. The Electrical current measuring device 10 also has a computing unit 18 which is intended to determine the primary signal 14 from the secondary signal 16. The computing unit 18 is connected to the inductive coupling unit 12 in such a manner that the secondary signal 16 is supplied to the computing unit 18 for further processing.

FIG. 2 shows an exemplary temporal profile of a primary signal 14 and a secondary signal 16. Both the primary signal 14 and the secondary signal 16 have a sinusoidal profile. On account of a transformation ratio of the inductive coupling unit 12, the secondary signal 16 has a lower amplitude than the primary signal 14. In the situation shown in FIG. 2, the primary signal 14 can be directly inferred from the secondary signal 16 with a known transformation ratio. FIG. 3 shows a further exemplary temporal profile of a primary signal 14 and a secondary signal 16 in the event of saturation of the inductive coupling unit 12. Whereas the primary signal 14 has a sinusoidal profile, it is shown that the absolute value of the secondary signal 16 is too small and the secondary signal is recorded with a leading phase angle on account of the zero crossings which have been advanced. In the situation shown in FIG. 3, the primary signal 14 cannot be directly inferred from a secondary signal 16 with only knowledge of the transformation ratio.

The computing unit 18 is intended to take into account at least one higher harmonic of the secondary signal 16 when determining the primary signal 14. The computing unit 18 is intended to take into account an amplitude and a phase angle of the higher harmonic. The higher harmonic is a low-order higher harmonic of the secondary signal 16 and is preferably the third harmonic of the secondary signal 16 for signals without a DC component. The higher harmonic of the secondary signal 16 can be evaluated, for example, according to a Fourier analysis by means of Fourier filtering.

The computing unit 18 is intended to use the higher harmonic to determine a correction value k for determining the primary signal 14. The following approach results with the complex vectors for the primary signal 14 ($I_p$) and the secondary signal 16 ($I_s$) and the correction value k:

$$I_s = k \times I_p$$

The complex correction value k is equal to 1 in the event of undistorted transmission by the inductive coupling unit 12. With increasing saturation of the inductive coupling unit 12, the absolute value of the complex correction value k becomes smaller. On account of the dips in the secondary signal 16 and the advance of the zero crossings which is caused thereby (cf. FIGS. 2 and 3), the angle of the complex correction value k also changes.

The computing unit 18 is intended to determine the correction value k using a ratio of the higher harmonic to a fundamental of the secondary signal 16. FIG. 4 shows the absolute value and angle of the primary signal 14 ($I_p$) in a first curve 34, the absolute value and angle of the fundamental ($I_{s1}$) of the secondary signal 16 in a second curve 36 and the absolute value and angle of the third harmonic ($I_{s3}$) of the secondary signal 16 in a third curve 38 on the basis of relative saturation of the coupling unit 12. In FIG. 4, the absolute value is plotted on the ordinate axis 40 of the upper graph, whereas the angle in degrees is plotted on the ordinate axis 42 of the lower graph. The relative saturation in per cent is respectively plotted on the abscissa axes 44, 46 of the graphs. A clear relationship between the primary signal 14 ($I_p$) and the fundamental ($I_{s1}$) of the secondary signal 16 and the third harmonic ($I_{s3}$) of the secondary signal 16 is shown. According to FIG. 4, in the event of saturation of the coupling unit 12, there is a clear relationship between the instantaneous saturation of the coupling unit 12 and a ratio of the third harmonic ($I_{s3}$) of the secondary signal 16 to the fundamental ($I_{s1}$) of the secondary signal 16. The correction value k is advantageously determined using the absolute value ratio of the third harmonic ($I_{s3}$) of the secondary signal 16 to the fundamental ($I_{s1}$) of the secondary signal 16, which is illustrated in a fourth curve 48:

$$x = |I_{s3}/I_{s1}|$$

The dependence of the correction value k on the ratio x is clear. FIG. 5 shows the corresponding profile of the correction value k on the basis of the ratio x with the absolute value and angle in a further curve 50. In FIG. 5, the absolute value is plotted on the ordinate axis 52 of the upper graph, whereas the angle in degrees is plotted on the ordinate axis 54 of the lower graph. The ratio x is respectively plotted on the abscissa axes 56, 58 of the graphs. The complex vector of the primary signal 14 can therefore be derived from the secondary signal 16 for sinusoidal primary signals 14 for each degree of saturation of the coupling unit 12:

$$I_p = I_s/k$$

The invention claimed is:

1. An electrical current measuring device for measuring at least one alternating current, comprising:
   an inductive coupling unit configured to convert at least one electrical primary signal into at least one electrical secondary signal; and
   a computing unit configured to determine the primary signal from the secondary signal, wherein
   the computing unit is configured to take into account at least one higher harmonic of the secondary signal in determining the primary signal, and
   the computing unit is configured to determine a correction value for determining the primary signal from the fundamental of the secondary signal based on the at least one higher harmonic of the secondary signal.

2. The electrical current measuring device according to claim 1, wherein the computing unit is configured to take into account an amplitude of the higher harmonic.

3. The electrical current measuring device according to claim 1, wherein the computing unit is configured to take into account a phase angle of the higher harmonic.

4. The electrical current measuring device according to claim 1, wherein the higher harmonic is an odd higher harmonic of the secondary signal.

5. The electrical current measuring device according to claim 4, wherein the higher harmonic is the third harmonic of the secondary signal.

6. The electrical current measuring device according to claim 4, wherein the computing unit is configured to determine the correction value using a ratio of the higher harmonic to the fundamental of the secondary signal.

7. The electrical current measuring device according to claim 1, wherein the primary signal is a sinusoidal alternating current signal.

8. An AC voltage installation having at least one electrical current measuring device according to claim 1.

9. A method of using an electrical current measuring device for measuring at least one alternating current, comprising:
   converting, via an inductive coupling unit, at least one electrical primary signal into at least one electrical secondary signal;
   determining, via a computing unit, the primary signal from the secondary signal, wherein at least one higher harmonic of the secondary signal is taken into account in determining the primary signal; and determining, via the computing unit, a correction value for determining the primary signal from the fundamental of the secondary signal based on the at least one higher harmonic of the secondary signal.

* * * * *